(12) United States Patent
Jeong

(10) Patent No.: US 9,647,175 B2
(45) Date of Patent: May 9, 2017

(54) LIGHT EMITTING ELEMENT AND LIGHTING DEVICE COMPRISING SAME

(71) Applicant: LG INNOTEK CO., LTD., Seoul (KR)

(72) Inventor: Jong Pil Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/101,844

(22) PCT Filed: Oct. 6, 2014

(86) PCT No.: PCT/KR2014/009361
§ 371 (c)(1),
(2) Date: Jun. 3, 2016

(87) PCT Pub. No.: WO2015/083932
PCT Pub. Date: Jun. 11, 2015

(65) Prior Publication Data
US 2016/0380155 A1    Dec. 29, 2016

(30) Foreign Application Priority Data
Dec. 5, 2013  (KR) .................... 10-2013-0150702

(51) Int. Cl.
*H01L 33/24* (2010.01)
*H01L 33/32* (2010.01)
*H01L 33/02* (2010.01)

(52) U.S. Cl.
CPC .......... *H01L 33/325* (2013.01); *H01L 33/025* (2013.01); *H01L 33/24* (2013.01)

(58) Field of Classification Search
CPC .............................. H01L 33/025; H01L 33/24
See application file for complete search history.

(56) References Cited

U.S. PATENT DOCUMENTS

| 8,110,484 B1* | 2/2012 | Sato .................... C30B 25/04 |
| | | 257/E21.113 |
| 2005/0161697 A1* | 7/2005 | Nakahata ............... C30B 25/02 |
| | | 257/103 |
| 2007/0057249 A1 | 3/2007 | Kim et al. |

(Continued)

FOREIGN PATENT DOCUMENTS

| KR | 10-2009-0006609 A | 1/2009 |
| KR | 10-2010-0093872 A | 8/2010 |

(Continued)

*Primary Examiner* — Evan Pert
(74) *Attorney, Agent, or Firm* — Birch, Stewart, Kolasch & Birch, LLP

(57) ABSTRACT

The present disclosure provides a light emitting element, wherein each of first and second semiconductor layers has first and second pits disposed therein, wherein the first pit has a first depth and the second pit has a second depth smaller than the first depth, and the first and second pits are coupled to each other, wherein a density of the second pits in an upper portion of the second semiconductor layer is lower than a density of the second pits in an upper portion of the first semiconductor layer, wherein a density of the first pits in the upper portion of the second semiconductor layer is equal to a density of the first pits in the upper portion of the first semiconductor layer.

20 Claims, 8 Drawing Sheets

(56) References Cited

U.S. PATENT DOCUMENTS

| | | |
|---|---|---|
| 2010/0207097 A1 | 8/2010 | Oh et al. |
| 2010/0327256 A1* | 12/2010 | Yi .................... H01L 33/007 257/13 |
| 2011/0121357 A1 | 5/2011 | Lester et al. |
| 2011/0309327 A1* | 12/2011 | Jeong .................... H01L 33/32 257/13 |
| 2012/0211870 A1* | 8/2012 | Figuet ................. H01L 21/0237 257/615 |
| 2012/0319126 A1 | 12/2012 | Butendeich et al. |
| 2013/0082273 A1 | 4/2013 | Ting |
| 2014/0103359 A1 | 4/2014 | Shim et al. |

FOREIGN PATENT DOCUMENTS

| | | |
|---|---|---|
| KR | 10-2013-0039169 A | 4/2013 |
| WO | WO 2013/015472 A1 | 1/2013 |

\* cited by examiner

LIGHT EMITTING ELEMENT AND LIGHTING DEVICE COMPRISING SAME

CROSS REFERENCE TO RELATED APPLICATIONS

This application is the National Phase of PCT International Application No. PCT/KR2014/009361, filed on Oct. 6, 2014, which claims priority under 35 U.S.C. 119(a) to Patent Application No. 10-2013-0150702, filed in Republic of Korea on Dec. 5, 2013, all of which are hereby expressly incorporated by reference into the present application.

BACKGROUND

Field of the Present Disclosure

Embodiments of the present disclosure relate to a light emitting element and a lighting device comprising the same.

Discussion of the Related Art

The group III-V nitride semiconductor has been popular as a key material for light emitting devices including a light emitting diode (LED) or laser diode (LD), etc. due to its physical and/or chemical properties. The group III-V nitride semiconductor may be generally formed of a semiconductor material with a composition $In_xAl_yGa_{1-x-y}N$, where $0 \leq x \leq 1$, $0 \leq y \leq 1$, $0 \leq x+y \leq 1$.

The light emitting diode LED refers to a semiconductor device to convert an electric energy to a light beam including an infrared light beam using characteristics of a compound semiconductor. This converted light beam may be used as a light source or a signal.

The light emitting diode LED or laser diode LD formed of the nitride semiconductor material has been mainly employed as a light emitting device to generate the light beam. In particular, the light emitting diode LED or laser diode LD may act as a light source for a keypad light emitting module, a display device, a signboard, a lighting device, etc.

SUMMARY

Embodiments of the present disclosure provide a light emitting device with pits having a uniform size.

Embodiments of the present disclosure provide a light emitting device with improved light emitting efficiency in an active layer thereof.

In one aspect of the present disclosure, there is provided a light emitting device comprising: a first semiconductor layer; a second semiconductor layer disposed on the first semiconductor layer; an active layer disposed on the second semiconductor layer; and a third semiconductor layer disposed on the active layer, wherein the second semiconductor layer includes a first nitride layer and a second nitride layer on the first nitride layer, wherein the first nitride layer is AlGaN-based semiconductor, and the second nitride layer is formed of a different semiconductor from a semiconductor of the first nitride layer, wherein each of the first and second semiconductor layers has first and second pits disposed therein, wherein the first pit has a first depth from a top surface of each of the first and second semiconductor layers, and the second pit has a second depth smaller than the first depth, and the first and second pits are connected to each other, wherein a density of the second pits in an upper portion of the second semiconductor layer is lower than a density of the second pits in an upper portion of the first semiconductor layer, wherein a density of the first pits in the upper portion of the second semiconductor layer is equal to a density of the first pits in the upper portion of the first semiconductor layer.

Embodiments of the present disclosure may have follows effects, but not limited thereto:

Embodiments of the present disclosure allow the less defective active layer.

Embodiments of the present disclosure allow the pits to have the uniform size.

Embodiments of the present disclosure allow the pits acting as a non-light emitting region to be removed.

Embodiments of the present disclosure allow the pits acting as a non-light emitting region below the active layer to be blocked, thereby to suppress reduction of the light emitting efficiency.

Embodiments of the present disclosure allow the pits acting as a non-light emitting region below the active layer to be blocked, thereby to suppress deterioration of an electrical property of the light emitting device.

Embodiments of the present disclosure allow the light emitting device to have a strong resistance to ESD (electrostatic discharge).

Embodiments of the present disclosure allow the pits to have the uniform size, leading to improved reliability of the light emitting device and the lighting device having the same.

BRIEF DESCRIPTIONS OF THE DRAWINGS

The accompanying drawings, which are included to provide a further understanding of the present disclosure and are incorporated in and constitute a part of this specification, illustrate embodiments of the present disclosure and together with the description serving to explain the principles of the present disclosure. In the drawings.

Figure 6:
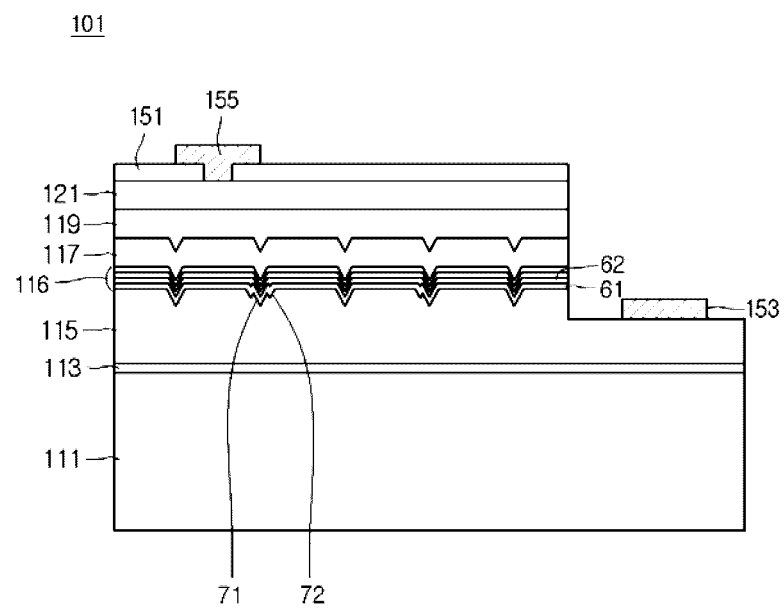
FIG. 6 illustrates a side cross-sectional view of a first example of the light emitting device of FIG. 1 with electrodes applied thereto.
Figure 12:
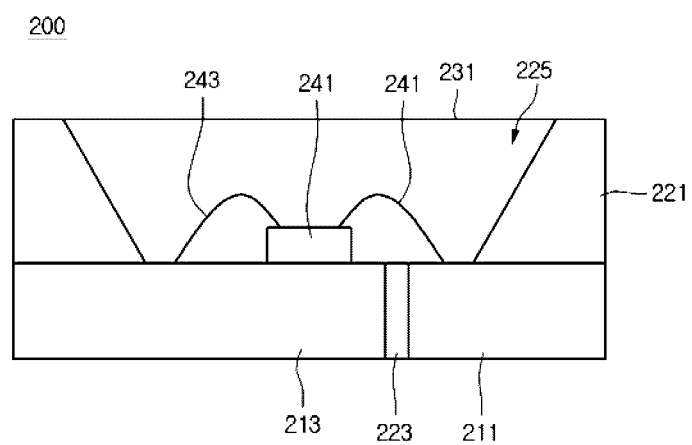

FIG. 12 schematically shows a side cross-sectional view of a light emitting device package with the light emitting device in FIG. 6.

Figure 13:
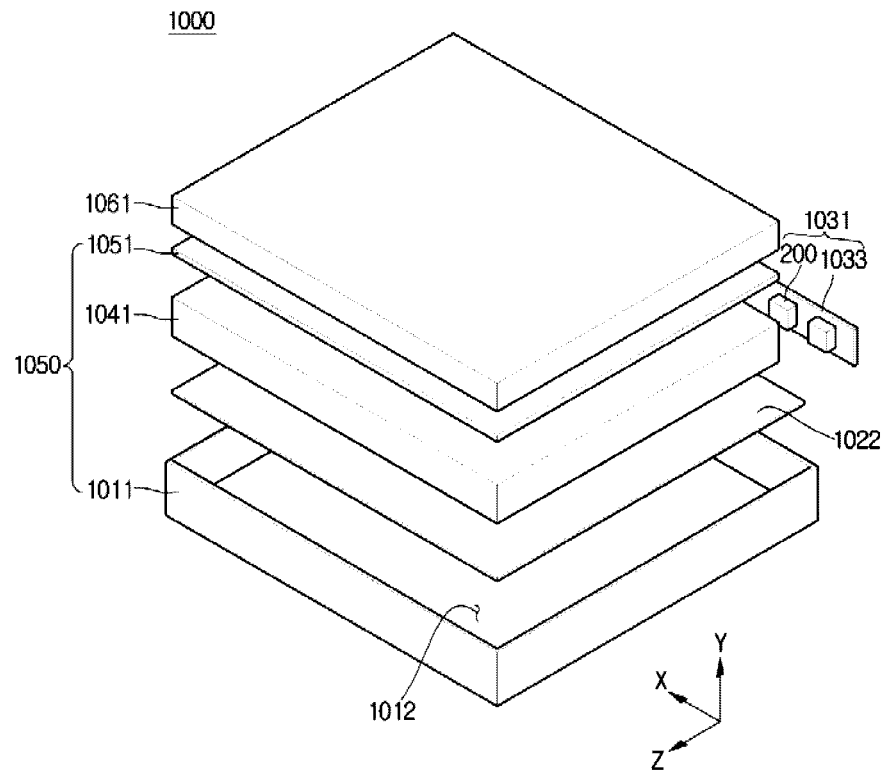

FIG. 13 is a perspective view showing a display apparatus having the light emitting device according to the embodiment.

Figure 14:
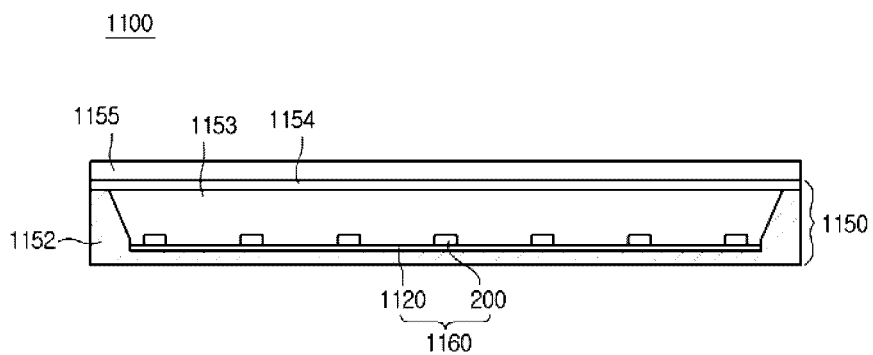
Figure 15:
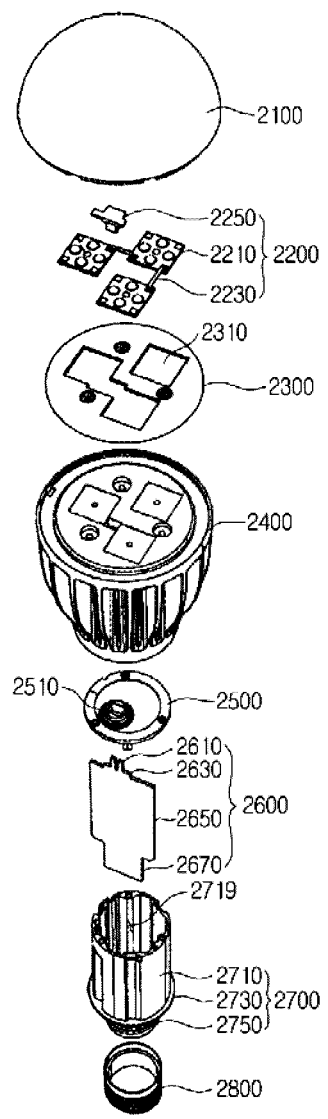

FIG. 14 is a sectional view showing a display apparatus according to the embodiment; and FIG. 15 is an exploded perspective view showing a lighting device having the light emitting device according to the embodiment.

DETAILED DESCRIPTIONS

In the description of the embodiments, it will be understood that when a substrate, a frame, a sheet, a layer, or a pattern is referred to as being "on" another substrate, another frame, another sheet, another layer, or another pattern, it can be "directly" or "indirectly" on the other substrate, the other frame, the other sheet, the other layer, or the other pattern may also be present. In contrast, when a part is referred to as being "directly on" another part, the intervening layer is not present. Such a position of on or under of the layer has been described with reference to the drawings.

Hereinafter, various embodiments of the present disclosure will be described in details with reference to attached drawings.

Figure 1:
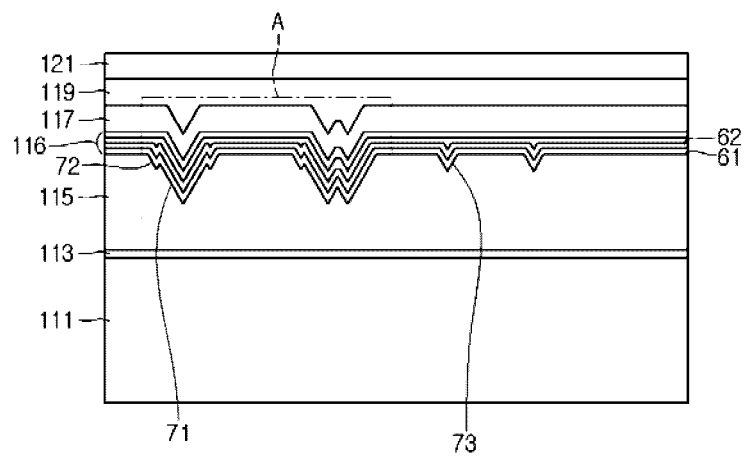
FIG. 1 illustrates a side cross-sectional view of a light emitting device in accordance with a first embodiment of the present disclosure.
Figure 2:
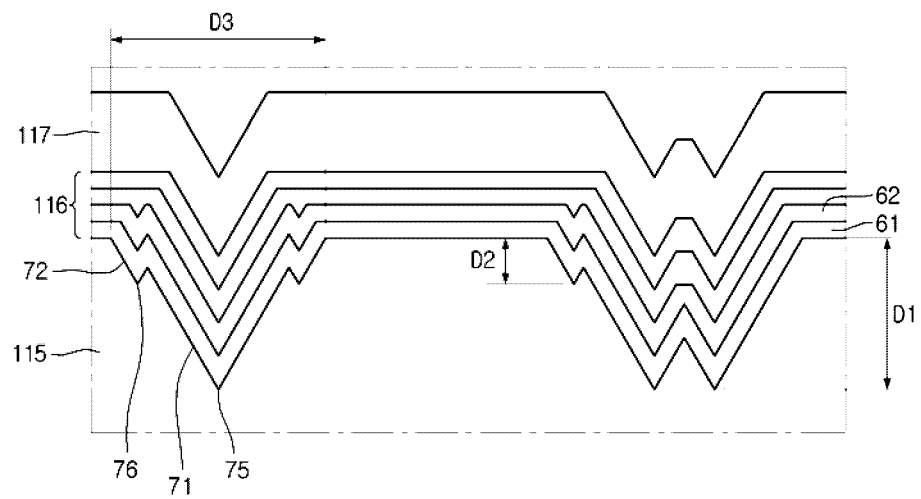
FIG. 2 illustrates an enlarged cross-sectional view of a portion in FIG. 1.
Figure 3:
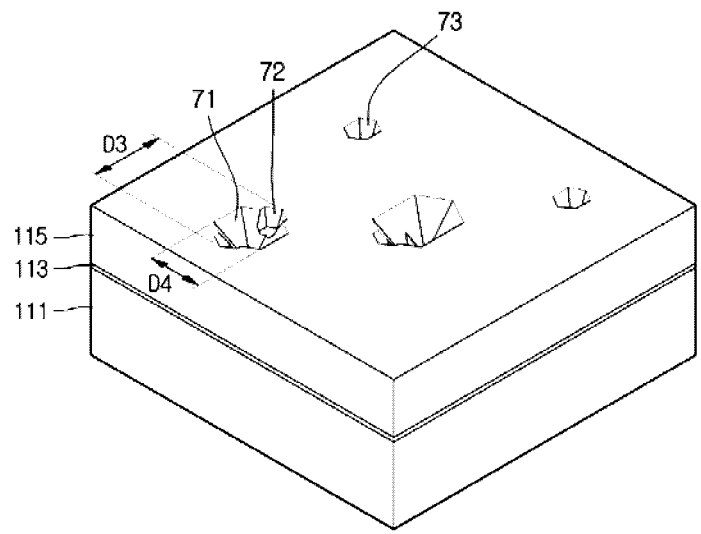
FIG. 3 illustrates a perspective view of pits in a first semiconductor layer of the light emitting device of FIG. 1.
Figure 4:
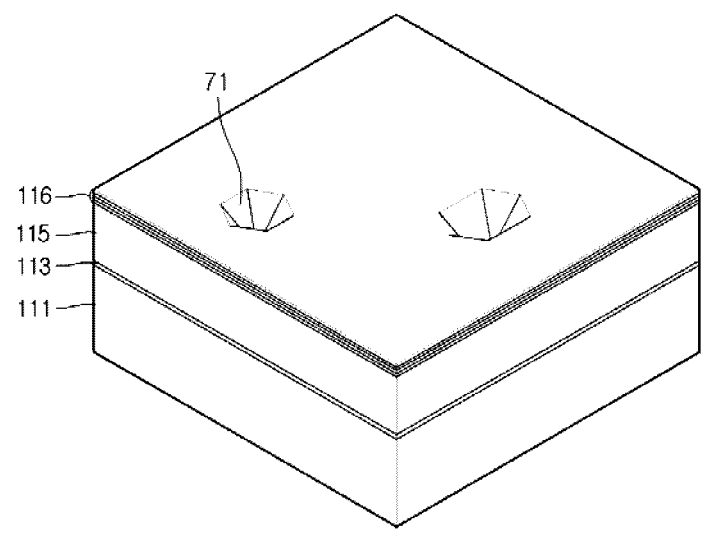
FIG. 4 illustrates a perspective view of pits in a second semiconductor layer of the light emitting device of FIG. 1.

FIG. 1 illustrates a side cross-sectional view of a light emitting device in accordance with a first embodiment of the present disclosure. FIG. 2 illustrates an enlarged cross-sectional view of a portion in FIG. 1. FIG. 3 illustrates a perspective view of pits in a first semiconductor layer of the light emitting device of FIG. 1. FIG. 4 illustrates a perspective view of pits in a second semiconductor layer of the light emitting device of FIG. 1.

Referring to FIG. 1 to FIG. 4, the light emitting device may include a substrate 111, a buffer layer 113 disposed on the substrate 111, a first semiconductor layer 115 disposed on the buffer layer 113, a plurality of pits 71, 72, and 73 disposed in the first semiconductor layer 115, a second semiconductor layer 116 disposed on the first semiconductor layer 115, an active layer 117 disposed on the second semiconductor layer 116, a third semiconductor layer 119 disposed on the active layer 117, and a fourth semiconductor layer 121 disposed on the third semiconductor layer 119.

The substrate 111 may be a substrate for growth of a semiconductor single crystal thereon, for example, for growth of a nitride single crystal thereon. The substrate 111 may be formed of at least one selected from a group consisting of sapphire ($Al_2O_3$), SiC, Si, GaAs, GaN, ZnO, Si, GaP, InP, Ge, and $Ga_2O_3$. The substrate 111 may be a transparent, insulating, or conductive substrate. The sapphire has a crystal structure having a hexa-rhombo R3c symmetry, where lattice constants in c-axis and a-axis directions are respectively 13.001 Å and 4.758 Å, and having a C (0001) face, an A (1120) face, a R (1102) face, etc. In this connection, on the C (0001) face, a nitride thin film growth may be relatively easy. Further, the sapphire may be stable at a high temperature. Thus, the sapphire substrate may be mainly employed for growth of the nitride semiconductor thereon.

The substrate 111 may have a thickness of about 120 μm to 500 μm, and may be formed of a material with a refractive index equal to or smaller than 2.4, for example, equal to or smaller than 2.

The substrate 111 may have the same or different adjacent sides. For example, an area thereof may be equal to or larger than 0.3 mm×0.3 mm. In case of the large substrate, the area thereof may be, for example, equal to or larger than 1 mm×1 mm. When viewed above, the substrate 111 may have a polygonal shape such as a rectangular or hexagonal shape. The present disclosure is not limited thereto.

The buffer layer 113 may be disposed on the substrate 111, and may be formed of a single layer or a stack of layers via a selective use between II group to VI group compound semiconductors. The buffer layer 113 may be formed of, for example, III group and V group compound semiconductors. In this connection, the semiconductor layer may be formed of, for example, a compound semiconductor having a composition $Al_xIn_yGa_{1-x-y}N$ where 0≤x≤1, 0≤y≤1, 0≤x+y≤1. In this case, generally, the compound semiconductor may include at least one from GaN, InN, AlN, InGaN, AlGaN, InAlGaN, and AlInN. The buffer layer 113 may be mainly grown on a growth face (0001) of the substrate 111. When a dislocation occurs due to a lattice constant, the dislocation may propagate mainly in the growth direction.

Between the buffer layer 113 and the first semiconductor layer 115, there may be disposed an un-doped semiconductor layer. The un-doped semiconductor layer may be formed of a low-conductivity layer having a conductivity than that of an n-type semiconductor layer. At least one layer of the buffer layer 113 and un-doped semiconductor layer may have a dislocation.

The first semiconductor layer 115 may be disposed on the buffer layer 113 or the un-doped semiconductor layer. The first semiconductor layer 115 may contain a first conductive dopant. The first conductive dopant may be an n-type dopant, and may include Si, Ge, Sn, Se, or Te. The first semiconductor layer 115 may be formed of III group to V group compound semiconductors, for example, a compound semiconductor formed of any one selected from GaN, InN, AlN, InGaN, AlGaN, InAlGaN, and AlInN. The first semiconductor layer 115 may be formed of, for example, a semiconductor with a composition $In_xAl_yGa_{1-x-y}N$ where 0≤x≤1, 0≤y≤1, 0≤x+y≤1.

The plurality of pits 71, 72, and 73 may be disposed in the first and second semiconductor layer 115 and 116. For example, the first semiconductor layer 115 may have a plurality of pits 71, 72, and 73 formed therein, where each of the plurality of pits 71, 72, and 73 has a width decreasing downwardly. Thus, each of the plurality of pits 71, 72, and 73 may have a side cross-sectional shape V. Further, each of the plurality of pits 71, 72, and 73 may have, for example, a hexagonal shape when viewed above. Thus, when each of the plurality of pits 71, 72, and 73 may have an increasing dimension as the first semiconductor layer 115 has an increasing thickness. Each of the plurality of pits 71, 72, and 73 may have a side surface inclined, for example, at an angle between 35 to 60 degrees. Each of the plurality of pits 71, 72, and 73 may be connected to at least one propagating dislocation.

Among the plurality of pits 71, 72, and 73, a first pit 71 may have a first depth from a top surface of one of the first and second semiconductor layers 115 and 116, and a second pit 72 and/or a third pit 73 may have a depth smaller than that of the first pit 71. For example, the first semiconductor layer 115 may have the first pit 71 with a first depth D1 from a top surface thereof, and the second pit 72 and third pit 73, both of which have a second depth D2 smaller than that of the first pit 71. The first depth D1 may be equal or larger than 15 nm from the top surface of the first semiconductor layer 115. For example, the first depth D1 may be 15 nm to 100 nm from the top surface of the first semiconductor layer 115. Further, when the first pit 71 is plural, the depths thereof may be the same or vary within the range of the first depth D1. The second depth D2 may be smaller than 15 nm from the top surface of the first semiconductor layer 115. For example, the second depth D2 may be 2 nm to 15 nm from the top surface of the first semiconductor layer 115. Further, when the second pit 72 is plural, the depths thereof may be the same or vary within the range of the second depth D2. Further, when the third pit 73 is plural, the depths thereof may be the same or vary within the range of the second depth D2.

Referring to FIG. 3 and FIG. 4, in the first semiconductor layer 115, the second pit 72 may be connected to or be in a contact with the first pit 71. At least one of the second pits 72 may be connected to or be in a contact with the single first pit 71. The plural second pits 72 may be disposed to vertically overlap the first pit 71 region. When the second pit 72 and the first pit 71 are merged, the merged pits structure may have a width D3 which may be larger than a width D4 of the first pit 71. In the merged pits structure, a plurality of lowest apexes 75 and 76 are spaced from each other. The inclined side surface of the first pit 71 may be connected to the inclined side surface of the second pit 72. Thus, when the inclined side surface of the first pit 71 meet the inclined side surface of the second pit 72, a corner portion may be formed at an intersection thereof. In this connection, the intersection may have a lower level than that of the top surface of the first semiconductor layer 115. For example, the intersection may have a higher level than those of the lowest apexes 75 and 76 of the first and second pit 71 and 72. The merged structure of at least two pits may be considered as a defect which has an elongate shape when viewed above.

In an alternative, in the first semiconductor layer 115, the first pit 71 may be plural and then the plural first pits 71 may be merged with each other together. In this connection, an intersection between inclined side surfaces of adjacent first pits respectively may have a lower level than that of the top surface of the first semiconductor layer 115. However, the present disclosure is not limited thereto.

In the first semiconductor layer 115, the third pit 73 may be formed to be spaced from the merged structure of the first and second pits 71 and 72. The third pit 73 may have the same or different depth as or from that of the second pit 72. When the first semiconductor layer 115 grows at a temperature of 500° C. to 1000° C., the pits 71, 72, and 73 may be formed therein. In this connection, the pits 71, 72, and 73 may be connected to at least one dislocation (not shown). Further, the pits 71, 72, and 73 may be formed using a mask pattern.

The first semiconductor layer 115 may have a thickness larger than the first depth D1. The first semiconductor layer 115 may have the thickness, for example, equal to or larger than 50 nm. With respect to the first depth D1, the thickness of the first semiconductor layer 115 may be larger 2 to 50 times than the first depth D1. The first semiconductor layer 115 may be referred to as a "pit control layer" or "defect control layer". The present disclosure is not limited thereto.

The second semiconductor layer 116 may be disposed on the first semiconductor layer 115. The second semiconductor layer 116 may include a plurality of semiconductor layers, for example, a first nitride layer 61 and a second nitride layer 62. The first nitride layer 61 and the second nitride layer 62 may be vertically alternated with each other multiple times. For example, a stack of the first nitride layer 61 and the second nitride layer 62 may be a cycle of two to five times. In one example as shown in the figure, the first semiconductor layer 115 may contact the first nitride layer 61. In another example as not shown, the first semiconductor layer 115 may contact the second nitride layer 62. The second semiconductor layer 116 may contain a first conductive dopant, for example, an n-type dopant.

The first nitride layer 61 may be formed of a nitride semiconductor having aluminum Al therein, for example, an AlGaN based semiconductor such as AlGaN or InAlGaN. In the first nitride layer 61, the aluminum content may be in a range of 5% to 20%. When the first nitride layer 61 is formed of InAlGaN, the aluminum content may be in a range of 5% to 20%, the indium In content may be smaller than the aluminum content, and may be, for example, below or equal to 5%. The first nitride layer 61 may contain a first conductive dopant, for example, an n-type dopant. The first nitride layer 61 may have a thickness of 0.5 nm to 5 nm, for example, 0.5 nm to 2 nm. The first nitride layer 61 may have a thickness smaller than the first depth D1 of the first pit 71, and may be smaller, for example, ⅓ times than the first depth D1 of the first pit 71.

The second nitride layer 62 may be formed of a different nitride semiconductor from that of the first nitride layer 61. The second nitride layer 62 may be formed of InGaN or GaN. When the second nitride layer 62 is formed of InGaN, the indium In content may be equal or smaller than 7%.

The second nitride layer 62 may have a thickness of 0.5 nm to 5 nm, for example, 0.5 nm to 2 nm. The second nitride layer 62 may have a thickness smaller than the first depth D1 of the first pit 71, and may be smaller, for example, ⅓ times than the first depth D1 of the first pit 71. The second nitride layer 62 may have the same or smaller thickness as or than that of the first nitride layer 61.

When the first nitride layer 61 grows on the first semiconductor layer 115, the first nitride layer 61 may be disposed on the first to third pits 71, 72, and 73. In this connection, during the growth of the layer 61, the first nitride layer 61 may partially fill the second and third pits 72 and 73. That is, as the first nitride layer 61 grows to fill the pits with a smaller size or depth, the first nitride layer 61 allows smaller second and third pits 72 and 73 to be disposed in the second semiconductor layer 116.

Since the second nitride layer 62 grows in a way where a vertical growth is accelerated, the second nitride layer 62 allows the first to third pits 71, 72, and 73 to remain in the second nitride layer 62. In this connection, a stack of the first and second nitride layers 61 and 62 on the first semiconductor layer 115 region without the pits may have a thickness larger than that of a stack of the first and second nitride layers 61 and 62 on the first to third pits 71, 72, and 73 regions.

The first nitride layer 61 and the second nitride layer 62 may be vertically alternated with each other multiple times. The plurality of first nitride layers 61 may allow the sizes of the pits with a relatively smaller size or depth, for example, the sizes of the second and third pits 72 and 73 to be decreased gradually. In this way, in an upper portion of the first nitride layers 61, the second and third pits 72 and 73 may be not formed or may be removed. Since in a lower portion of the first nitride layer 61 adjacent to the first semiconductor layer 115, the second and third pits 72 and 73 are disposed, in a portion of the first nitride layer 61 adjacent to the active layer 119, the second and third pits 72 and 73 may not be formed. In a portion of the first nitride layer 61 adjacent to the active layer 119, the pits with a relatively larger size or depth, for example, the first pits 71 may be formed. The top surface of the second semiconductor layer 118 may include a top surface vertically overlapping the second pit 72 disposed in the first semiconductor layer 115. This first overlapping top surface may be flat. Further. The top surface of the second semiconductor layer 118 may include a top surface vertically overlapping the second pit 72 merged with the first pit 71 in the first semiconductor layer 115. This second overlapping top surface may be also flat. The top surface of the second semiconductor layer 118 may include a top surface vertically overlapping the third pit 73 disposed in the first semiconductor layer 115. This third overlapping top surface may be also flat. Due to the first to third flat top surfaces of the second semiconductor layer 118, the pits with the smaller size or depth may be prevented from propagating into the active layer 119, and, further, the pits with the smaller size or depth in the merged pits region may be prevented from propagating into the active layer 119. In this way, the active layer 119 may have improved quantum efficiency.

A stack of the first and second nitride layers 61 and 62 may have a cycle of two to five times. In this connection, in the vertical alternations, one of the first and second nitride layers 61 and 62 may additionally be disposed without disposing the corresponding layer of the other one thereon. The present disclosure is not limited thereto.

In the second semiconductor layer 116, the second and third pits 72 and 73 may not be disposed, that is, may be removed. This may allow the resulting pits to have a uniform size. Further, since the second pit 72 connected to the first pit 71 may be removed, the previous merged pits may be converted into a single pit. In this way, the number of the intersections between the merged pits, for example, the lowest apexes, or valleys may be reduced. In other words, since the second pit 72 and third pits 73 may be increasingly removed from the bottom to the top of the second semiconductor layer 116, the second semiconductor layer 116 may increasingly have flat top surfaces overlapping the underlying second pit 72 and third pit 73. In this way, as shown in FIG. 4, on the top surface of the second semiconductor layer 116, only the first pits 71 with the same size may be exposed. Each of the first pits 71 with the same size in the second semiconductor layer 116 may have a depth equal to or larger than 15 nm. The removed pits, this, the second and third pits may have a depth smaller than 15 nm as described above.

The pits density in the upper portion of the second semiconductor layer 116 may be smaller than that in the lower portion thereof. For example, the density of the second pit 72 or third pit 73 in the lower portion of the second semiconductor layer 116 or in the upper portion of the first semiconductor layer 115 may be higher than the density of the second pit 72 or third pit 73 in the upper portion of the second semiconductor layer 116.

For example, the latter density may be reduced by a percentage equal or larger than 70%, for example, a percentage equal or larger than 80% of the former density. Further, the density of the first pits 71 in the upper portion of the second semiconductor layer 116 may be same as that of the first pits 71 in the lower portion of the second semiconductor layer 116 or the upper portion of the first semiconductor layer 115.

Between the second semiconductor layer 116 and the active layer 117, a first clad layer may be formed. The first clad layer may be formed of a GaN-based semiconductor, whose bandgap may be larger than that of the active layer 117. The first clad layer may act to confine the carriers, and, may contain a n-type dopant.

Between the second semiconductor layer 116 and active layer 117, different semiconductor layers may be vertically alternated with each other to form a super-lattice structure. This supper-lattice structure may reduce a lattice defect. Each layer in the supper-lattice structure may have a thickness larger than or equal to several Å.

The active layer 117 may be disposed on the second semiconductor layer 116, and may have the first pits 71 disposed therein. In the active layer 117, the first pits 71 may have a uniform size. The above-described removal of the third pit 73 and second pit 72 may allow reduction of the non-light emitting area in the active layer 117. Further, the above-described removal of the third pit 73 and second pit 72 may allow an improved crystal quality of the active layer 117. The density of the pits having the size smaller than that of the first pit 71, for example, the second pits or third pits in the active layer 117 may be lower than the density of the second pits or third pits in the first semiconductor layer 115. Further, the density of the pits having the size smaller than that of the first pit 71, for example, the second pits or third pits in the active layer 117 may be reduced by a percentage larger than or equal to 80% of the density of the second pits or third pits in the first semiconductor layer 115.

The active layer 117 may include a single quantum well, multiple quantum wells (MQW), a quantum wire structure or a quantum dot structure. The active layer 117 may include vertical alterations of well layers and barrier layers. The well layer may include a composition $In_xAl_yGa_{1-x-y}N$ where $0≤x≤1, 0≤y≤1, 0≤x+y≤1$, while the barrier layer may include a composition $In_xAl_yGa_{1-x-y}N$, where $0≤x≤1, 0≤y≤1, 0≤x+y≤1$. The vertical alterations of the well layer/barrier layer may include at least one vertical alternations of, for example, InGaN/GaN, GaN/AlGaN, InGaN/AlGaN, InGaN/InGaN, InGaN/InAlGaN, or GaN/InAlGaN. The barrier layer may be formed of a semiconductor material having a bandgap wider than that of the well layer.

On the active layer 117, the third semiconductor layer 119 may be disposed. The third semiconductor layer 119 may be formed of a semiconductor doped with a second conductive dopant, and, thus, formed of, for example, a compound semiconductor selected from GaN, InN, AlN, InGaN, AlGaN, InAlGaN, and AlInN. The third semiconductor layer 119 may be formed of a p-type semiconductor layer, for example, with a composition $In_xAl_yGa_{1-x-y}N$ where $0≤x≤1, 0≤y≤1, 0≤x+y≤1$. The second conductive dopant may be a p-type dopant and may include Mg, Zn, Ca, Sr, or Ba.

The third semiconductor layer 119 may act as an electron blocking layer. For example, the third semiconductor layer 119 may be formed of P—AlGaN or P—InAlGaN. The third semiconductor layer 119 may act to suppress a propagation of the pits from the active layer 117. When the pits are exposed from the surface of the semiconductor device, the pits may affect the ESD (Electrostatic Discharge). Thus, the third semiconductor layer 119 may be disposed in a horizontal growth mode where the pits may not be formed, namely, may be removed. Some of the pits remaining in the active layer 117 may propagate into the third semiconductor layer 119. The present disclosure is not limited thereto.

The third semiconductor layer 119 may include a super-lattice structure, where the super-lattice structure may include an InGaN/GaN super-lattice structure or an AlGaN/GaN super-lattice structure. The super-lattice structure of the third semiconductor layer 119 may allow an abnormal current to be spread, to protect the active layer 117.

The fourth semiconductor layer 121 may be disposed on the third semiconductor layer 119 and may be formed of a different semiconductor from that of the third semiconductor layer 119. The fourth semiconductor layer 121 may contain a second conductive dopant. The fourth semiconductor layer 121 may be formed of one of compound semiconductors such as GaN, InN, AlN, InGaN, AlGaN, InAlGaN, and AlInN. The fourth semiconductor layer 121 may be formed of, for example, a p-type semiconductor layer with a composition $In_xAl_yGa_{1-x-y}N$ where $0≤x≤1, 0≤y≤1, 0≤x+y≤1$. For example, the fourth semiconductor layer 121 may be formed of P—GaN or P—InGaN. The second conductive dopant as the p-type dopant may include Mg, Zn, Ca, Sr, or Ba. The fourth semiconductor layer 121 may block the pits and, thus, disallow the pits exposure therefrom.

Further, in another example, the first and second semiconductor layers 115 and 116 may be a p-type semiconductor layer, while the third and fourth semiconductor layers 119,121 may be an n-type semiconductor layer. On the fourth semiconductor layer 121, an additional semiconductor layer may be disposed to have an opposite polarity to the second conductive polarity.

The light emitting device may include a stack of the n-type semiconductor layers 115 and 116, the active layer 117 and the p-type semiconductor layers 119,121. Alternatively, the light emitting structure may be implemented as one of a n-p junction structure, a p-n junction structure, a n-p-n junction structure, and a p-n-p junction structure. In this connection, "p" refers to a p-type semiconductor layer, "n" refers to a n-type semiconductor layer, "-" refers to a direct or indirect junction between the p-type semiconductor layer and n-type semiconductor layer. Hereinafter, for the sake of convenience of illustration, it may be assumed that the most-upper layer of the light emitting structure is the fourth semiconductor layer 121, that is, the second conductive semiconductor layer.

Figure 8:
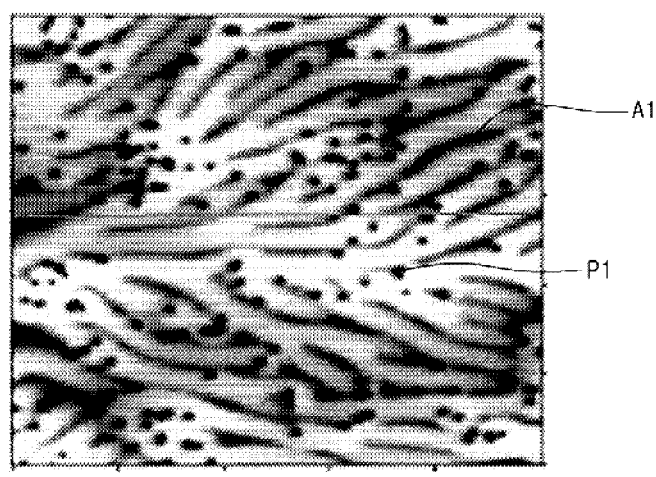
FIG. 8 illustrates an AFM (atomic force microscopy) image of a conventional light emitting device.
Figure 9:
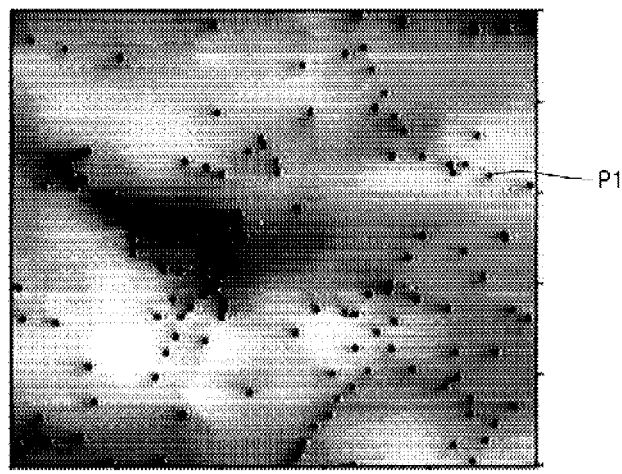
FIG. 9 illustrates an AFM image of the present light emitting device.

Now, a reference will be formed to AFM images of the light emitting devices as shown in FIG. 8 and FIG. 9. FIG. 8 illustrates an AFM (atomic force microscopy) image of a conventional light emitting device. FIG. 9 illustrates an AFM image of the present light emitting device. In the conventional light emitting device wherein the second semiconductor layer is absent, many valleys, each valley resulting from continuous connections of the adjacent pits P1, appear which may act as defect regions A1. Such defect regions A1 may act as non-light emitting regions. Thus, the conventional light emitting device has lowered light extraction efficiency. To the contrary, in the present light emitting device as shown in FIG. 9, the valleys as the defect regions A1 are significantly decreased compared to the conventional light emitting device as shown in FIG. 8. In this connection, as shown in FIG. 9, the pits P1 are spaced from each other to suppress the continuous connections of the adjacent pits P1. Thus, the present light emitting device has enhanced light extraction efficiency. In FIG. 8 and FIG. 9, each AFM image has a size of 10 μm×10 μm.

Figure 10:
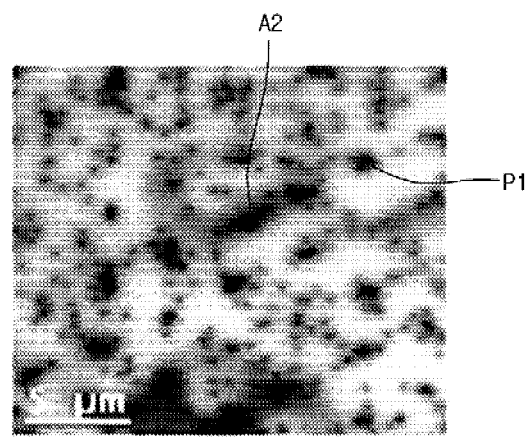
FIG. 10 illustrates a CL (cathodeoluminescence) image of a conventional light emitting device.
Figure 11:
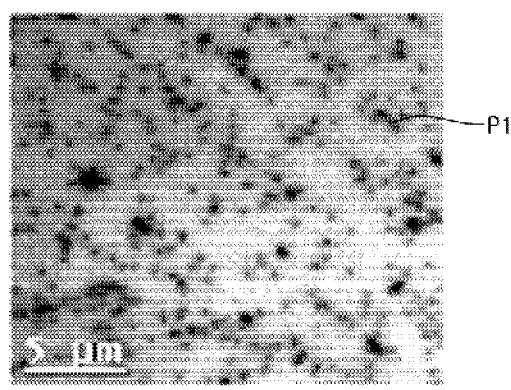
FIG. 11 illustrates a CL image of the present light emitting device.

FIG. 10 illustrates a CL (cathodeoluminescence) image of a conventional light emitting device. FIG. 11 illustrates a CL image of the present light emitting device. Referring to FIG. 10, in the conventional light emitting device, the continuous connections of the adjacent pits P1 frequently appear which may act as defect regions A2. Such defect regions A1 may act as non-light emitting regions. Thus, the conventional light emitting device has lowered light extraction efficiency. To the contrary, in the present light emitting device as shown in FIG. 11, the continuous connections of the adjacent pits P1 are significantly decreased compared to the conventional light emitting device as shown in FIG. 8. In this connection, as shown in FIG. 11, the pits P1 are spaced from each other to suppress the continuous connections of the adjacent pits P1. Thus, the present light emitting device has enhanced light extraction efficiency.

In another embodiment, the second semiconductor layer 116 including the first and second nitride layers 61 and 62 may be further disposed between the active layer 117 and third semiconductor layer 119, and/or between the third semiconductor layer 119 and the fourth semiconductor layer 121.

Figure 5:
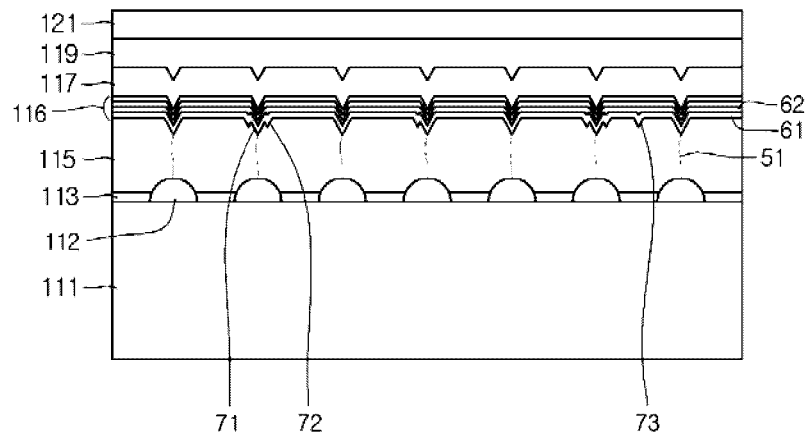
FIG. 5 illustrates a side cross-sectional view of a light emitting device in accordance with a second embodiment of the present disclosure.

FIG. 5 shows a side cross-sectional view of a light emitting device in accordance with a second embodiment of the present disclosure. For describing the second embodiment, the first embodiment may be referenced about the same components and configurations in this embodiment as those of the first embodiment.

Referring to FIG. 5, the light emitting device may include a stack of a substrate 111a having a plurality of convex portions 112 disposed thereon, a buffer layer 113, a first semiconductor layer 115, a second semiconductor layer 116, an active layer 117, a third semiconductor layer 119 and a fourth semiconductor layer 121 in this order.

The substrate 111 may be formed a transparent, insulating, or conductive substrate. The substrate 111 may be formed of, for example, at least one selected from a group consisting of sapphire ($Al_2O_3$), SiC, Si, GaAs, GaN, ZnO, Si, GaP, InP, Ge, and $Ga_2O_3$. The substrate 111 may have a thickness of about 120 μm to 500 μm, and may be formed of a material with a refractive index equal to or smaller than 2.4, for example, equal to or smaller than 2. The sapphire has a crystal structure having a hexa-rhombo R3c symmetry. In this connection, on the C (0001) face, a nitride thin film growth may be relatively easy. Further, the sapphire may be stable at a high temperature. Thus, the sapphire substrate may be mainly employed for growth of the nitride semiconductor thereon.

The substrate 111 may include the plurality of convex portions 112 disposed thereon. Each of the plurality of convex portions 112 may protrude from the substrate 111 toward the active layer 117. Each of the plurality of convex portions 112 may have a three-dimensional shape such as a semi-sphere shape, a convex dome shape, or a convex lens shape. The present disclosure is not limited thereto. For example, each of the plurality of convex portions 112 may have a three-dimensional polygonal shape.

The adjacent convex portions 112 may be spaced from each other. When viewed from the above, the plurality of convex portions 112 may be arranged in a matrix or stripe form. The convex portions 112 may be spaced from each other on a regular or irregular or random basis. The present disclosure is not limited thereto. The plurality of convex portions 112 may act to change a threshold angle of an incident light beam, to improve the light extraction efficiency.

A bottom width of the convex portion 112:a space between the convex portions be in a range of 1:1 to 4:2. The bottom width of the convex portion 112 may be, for example, in a range of 3 μm±0.5 μm, while the space between the convex portions may be, for example, in a range of 2 μm±0.5 μm. A height of each convex portion may be, for example, in a range of 0.8 μm to 2.5 μm.

The buffer layer 113 may be disposed on an exposed flat surface of the substrate 111 and partially on an outer surface of the convex portion 112. Although a portion of the buffer layer 113 is not shown, the buffer layer 113 may cover the highest point of the convex portion 112. The present disclosure is not limited thereto.

On the buffer layer 113, the first semiconductor layer 115 may be disposed. The first semiconductor layer 115 may be further disposed partially on an outer surface of the convex portion 112. In this connection, in an intersection region between the convex portion 112 and the first semiconductor layer 115, a dislocation 51 may be generated. The dislocation may propagate toward the top surface of the first semiconductor layer 115. Each dislocation 51 may be connected to each the first pits 71. The dislocations 51 disposed on the convex portions 112 may be merged with further dislocations (not shown) generated in a region other than the convex portion 112 region. The present disclosure is not limited thereto.

The plurality of pits 71, 72, and 73 disposed in the first semiconductor layer 115 may be classified into a first pit 71, a second pit 72 and a third pit 73. Among the first to third pits 71, 72, and 73, the second and third pits 72 and 73 may be removed using a stack structure of the first nitride layer 61/second nitride layer 62 of the second semiconductor layer 116. Thus, from the top surface of the second semiconductor layer 116, the first pit 71 or pits with the uniform size may be exposed. Each of the pits with the uniform size may have a depth larger than or equal to 15 nm, while the removed pits may have a depth smaller than 15 nm.

FIG. 6 illustrates a side cross-sectional view of a first example of the light emitting device of FIG. 1 with electrodes applied thereto.

Referring to FIG. 6, the light emitting device 101 may include a substrate 111, first and second semiconductor layers 115 and 116, an active layer 117, third and fourth semiconductor layers 119,121, a current spreading layer 151 on the fourth semiconductor layer 121, a first electrode 153 on at least one of the first and second semiconductor layers 115 and 116, and a second electrode 155 on the current spreading layer 151.

The current spreading layer 141 may cover 70% or more of an entire top surface of the fourth semiconductor layer 121, to act to spread the current for supply. The current spreading layer 151 may include a metal or transparent metal. The current spreading layer 151 may be formed of at least one selected from, for example, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ZnO, IrOx, RuOx, NiO, etc. The current spreading layer 151 may be disposed of a single layer or a stack of layers. The current spreading layer 151 may be disposed of a reflection electrode layer. In this case, the current spreading layer 151 may be formed of, for example, Al, Ag, Pd, Rh, Pt, Ir or an alloy of at least two thereof.

The second electrode 155 may be disposed on the fourth semiconductor layer 121 and/or on the current spreading layer 151, and may include an electrode pad. The second electrode 155 may further include a current spreading pattern such as an arm structure or finger structure. The second electrode 155 may be formed of a non-transparent metal with ohmic contact, adhesive, and/or bonding properties. The present disclosure is not limited thereto.

The second electrode 155 may cover 40% or less, for example, 20% or less of an entire top surface of the fourth semiconductor layer 121. The present disclosure is not limited thereto.

The first electrode 153 may be disposed on at least one of the first and second semiconductor layers 115 and 116. The first electrode 153 and the second electrode 155 may be formed of Ti, Ru, Rh, Ir, Mg, Zn, Al, In, Ta, Pd, Co, Ni, Si, Ge, Ag and Au or a selective alloy of at least two thereof.

On the surfaces of the semiconductor layers 113,115 and 116,117,121, insulating layers (not shown) may be further disposed. The insulating layer may serve to prevent short circuits between the semiconductor layers, and to prevent humidity penetrations thereto.

Figure 7:
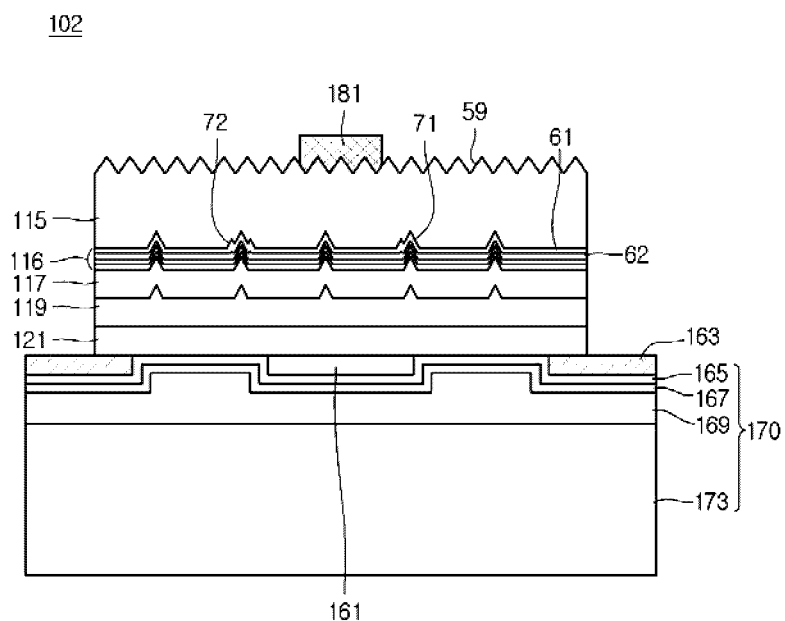
FIG. 7 illustrates a side cross-sectional view of a second example of the light emitting device of FIG. 1 with electrodes applied thereto.

FIG. 7 illustrates a side cross-sectional view of a second example of the light emitting device of FIG. 1 with electrodes applied thereto. For describing the second example of FIG. 7, the first example of FIG. 6 may be referenced about the same components and configurations in this embodiment as those of the first example.

Referring to FIG. 7, the light emitting device 102 may include a first electrode 181 and a second electrode 170 above and below the first semiconductor layer 115 respectively.

The substrate 111 and buffer layer 113 in FIG. 1 may be partially removed using a physical and/or chemical method. The first semiconductor layer 115 may include a conductive semiconductor layer for example, a n-type semiconductor layer. The substrate 111 may be partially removed using a physical method, for example, a laser lift off and/or a chemical method, for example, a wet etching, etc. The buffer layer may partially be removed to expose partially the first semiconductor layer 115. After an isolation etching through a removal direction of the substrate 111, the first electrode 181 may be disposed on the first semiconductor layer 115. The first electrode 181 may be disposed on different subregions. The first electrode 181 may have an arm or bridge pattern disposed therein. The present disclosure is not limited thereto. A portion of the first electrode 181 may act as a pad to be bonded to a wire (not shown) later.

Below the fourth semiconductor layer 121, the second electrode 170 may be disposed. The second electrode 170 may include a plurality of conductive layers, which, may include, for example, a contact layer 165, a reflection layer 167, a bonding layer 169 and a conductive support 173.

The contact layer 165 may be formed of a transparent and transparent material or metal. For example, the contact layer 165 may be formed of a low conductive material such as ITO, IZO, IZTO, IAZO, IGZO, IGTO, AZO, ATO or may be formed of Ni, Ag. Beneath the contact layer 165, the reflection layer 167 may be disposed, which may be formed of at least one selected from a group consisting of Ag, Ni, Al, Rh, Pd, Ir, Ru, Mg, Zn, Pt, Au, Hf and a combination thereof. The reflection layer 167 may partially contact the overlying fourth semiconductor layer 121. The contact may be an ohmic contact between the semiconductor and a metal, or the semiconductor and a low conductive material such as an ITO material. The present disclosure is not limited thereto.

Beneath the reflection layer 167, the bonding layer 169 may be disposed, which may be formed of a barrier metal or bonding metal. An example thereof may include at least one selected from a group consisting of Ti, Au, Sn, Ni, Cr, Ga, In, Bi, Cu, Ag and Ta and a selective alloy of at least two thereof.

Beneath the bonding layer 169, the conductive support 173 may be disposed. The conductive support 173 may be disposed of a metal or carrier substrate. The support may be formed of a conductive material such as Cu (copper), Au (gold), Ni (nickel), Mo (molybdenum), a Cu—W alloy, a carrier wafer formed of, for example, Si, Ge, GaAs, ZnO, SiC, etc. In an alternative, the conductive support 173 may be disposed of a conductive sheet.

On a top surface of the first semiconductor layer 115, a light extraction structure 59 such as a roughness structure may be disposed. On each of surfaces of the semiconductor layers 113,115 and 116,117,119,121, a insulating layer (not shown) may be disposed. The insulating layer may be further disposed on the light extraction structure 59.

Between the second electrode 170 and the fourth semiconductor layer 121, a current blocking layer 161 may be disposed in a region vertically overlapping the first electrode 181. In an outer periphery of a region between the second electrode 170 and the fourth semiconductor layer 121, a protective layer 163 may be disposed. Both the current blocking layer 161 and the protective layer 163 may be formed of a insulating material or a transparent conductive material. The present disclosure is not limited thereto. The current blocking layer 161 and the protective layer 163 may be formed of the same material or different materials. The present disclosure is not limited thereto.

<Light Emitting Device Package>

FIG. 12 schematically shows a light emitting device package with the light emitting device in FIG. 6.

Referring to FIG. 12, the light emitting device package 200 may include a body 221, a first lead electrode 211 and a second lead electrode 213, each electrode being at least partially disposed on the body 221, a light emitting device 241 electrically connected to the first lead electrode 211 and second lead electrode 213 on the body 221, and a molding member 231 covering the light emitting device 241 on the body 221.

The body 221 may be formed of, for example, a silicon material, a synthetic resin, or metal material, etc. When viewed above, the body 221 may have a cavity 225 defined therein, which has inclined side surfaces.

The first lead electrode 211 and the second lead electrode 213 may be electrically disconnected from each other. The first lead electrode 211 and the second lead electrode 213 may be configured to pass through the body 221. In other words, one portion of each the first lead electrode 211 and the second lead electrode 213 may be disposed within the cavity 225, while the other portion thereof may be disposed outside the body 221.

The first lead electrode 211 and second lead electrode 213 may act to supply an electric power to the light emitting device 241, and to reflect a light beam generated from the light emitting device 241, resulting in enhanced light extraction efficiency, and, further to dissipate outwardly a heat from the light emitting device 241. The first and second lead electrodes 211,213 may be formed of a metal, and may be spaced via a spacer 223 from each other.

The light emitting device 241 may be disposed on the body 221, or may be disposed on the first lead electrode 211 and/or second lead electrode 213.

The light emitting device 221 may be connected via a first wire 242 to the first lead electrode 211, and may be connected via a second wire 243 to the second lead electrode 213. The present disclosure is not limited thereto.

The molding member 231 may surround the light emitting device 241 to provide protection for the light emitting device 241. Further, the molding member 231 may contain therein a fluorescent substance, which may change a wavelength of a light beam generated from the light emitting device 241.

<Lighting System>

The light emitting device or the light emitting device package according to the embodiment is applicable to a lighting system. The lighting system includes a structure in which a plurality of light emitting devices or the light emitting device package are arrayed. The lighting system includes a display apparatus shown in FIGS. 13 and 14, a lighting apparatus shown in FIG. 15, a lighting lamp, a camera flash, a signal lamp, a headlamp for a vehicle, and an electronic display.

FIG. 13 is an exploded perspective view showing a display apparatus having the light emitting device according to the embodiment.

Referring to FIG. 13, a display apparatus 1000 according to the embodiment includes a light guide plate 1041, a light emitting module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041, the optical sheet 1051, and the light unit 1050 may be defined as a light unit 1050.

The light guide plate 1041 diffuses the light supplied from the light emitting module 1031 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphtha late) resin.

The light emitting module 1031 is disposed on at least one side of the light guide plate 1041 to supply the light to at least one side of the light guide plate 1041. The light emitting module 1031 serves as the light emitting of the display device.

At least one light emitting module 1031 is disposed to directly or indirectly supply the light from one side of the light guide plate 1041. The light emitting module 1031 may include a board 1033 and the light emitting device according to the embodiments or the light emitting device package 200. The light emitting device or the light emitting device package 200 are arranged on the board 1033 while being spaced apart from each other at the predetermined interval.

The board 1033 may include a printed circuit board (PCB) including a circuit pattern (not shown). In addition, the board 1033 may also include a metal core PCB (MCPCB) or a flexible PCB (FPCB) as well as a typical PCB, but the embodiment is not limited thereto. If the light emitting device package 200 is installed on the side of the bottom cover 1011 or on a heat dissipation plate, the board 1033 may be omitted. The heat dissipation plate partially makes contact with the top surface of the bottom cover 1011 for heat radiation.

In addition, the light emitting device package 200 are arranged such that light exit surfaces to discharge light of the light emitting device package 200 are spaced apart from the light guide plate 1041 by a predetermined distance on the board 1033, but the embodiment is not limited thereto. The light emitting device package 200 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be connected with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light emitting module 1031 as optical members, but the embodiment is not limited thereto.

FIG. 14 is a sectional view showing a display apparatus according to the embodiment.

Referring to FIG. 14, the display apparatus 1100 includes a bottom cover 1152, a board 1120 on which the light emitting device 1124 are arrayed, an optical member 1154, and a display panel 1155.

The board 1120 and the light emitting device 1124 may constitute the light emitting module 1160. In addition, the bottom cover 1152, at least one light emitting module 1160, and the optical member 1154 may constitute the light unit. The bottom cover 1151 can be disposed with a receiving section 1153, but the embodiment is not limited thereto. The light emitting module 1160 includes a board 1120, and a plurality of light emitting device packages 200 arranged on the board 1120 or a light emitting device package 200 or the light emitting device (e.g. LED chip).

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light emitting module 1160 in order to convert the light emitted from the light emitting module 1160 into the surface light.

FIG. 15 is an exploded perspective view showing a lighting device having the light emitting device according to the embodiment.

Referring to FIG. 15, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device or the light emitting device package according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 250. For example, the parts include a DC converter, a driving chip to drive the light source module 220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

The present embodiments may improve reliability of the light emitting device. The light emitting device of the present embodiments may have their applications for a lighting or illumination device such as a lighting lamp, indoor lamp, outdoor lamp, indication lamp, etc. using the LED.

The above description is not to be taken in a limiting sense, but is formed merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A light emitting element comprising:
a first semiconductor layer;
a second semiconductor layer disposed on the first semiconductor layer;
an active layer disposed on the second semiconductor layer; and
a third semiconductor layer disposed on the active layer,
wherein the second semiconductor layer includes a first nitride layer and a second nitride layer on the first nitride layer on the first nitride layer, wherein the first nitride layer is AlGaN-based semiconductor, and the second nitride layer is formed of a different semiconductor from a semiconductor of the first nitride layer,
wherein each of the first and second semiconductor layers has first and second pits disposed therein, wherein the first pit has a first depth from a top surface of each of the first and second semiconductor layers, and the second pit has a second depth smaller than the first depth, and the first and second pits are connected to each other,
wherein a density of the second pits in an upper portion of the second semiconductor layer is lower than a density of the second pits in an upper portion of the first semiconductor layer, and
wherein a density of the first pits in the upper portion of the second semiconductor layer is equal to a density of the first pits in the upper portion of the first semiconductor layer.

2. The element of claim 1, wherein the first nitride layer include a semiconductor of AlGaN or InAlGaN.

3. The element of claim 2, wherein the second nitride layer includes a semiconductor of GaN or InGaN.

4. The element of claim 3, wherein the first semiconductor layer has a thickness greater than the first depth.

5. The element of claim 4, wherein the first nitride layer has a thickness smaller than or equal to ⅓ of the first depth.

6. The element of claim 5, wherein the second depth is smaller than 15 nm.

7. The element of claim 5, where the first nitride layer contains aluminum (Al), whose content is 5% to 20%.

8. The element of claim 6, wherein the second nitride layer is formed of an InGaN semiconductor, and the indium (In) content in the second nitride layer is equal to or smaller than 7%.

9. The element of claim 4, wherein the second nitride layer has a thickness equal to or smaller than a thickness of the first nitride layer.

10. The element of claim 8, wherein each of the first and second nitride layers has a thickness of 0.5 nm to 5 nm, and comprising a dislocation connected to the first and second pits.

11. The element of claim 4, wherein a stack of first and second nitride layers includes a cycle of two to five times.

12. The element of claim 11, wherein both the first and second semiconductor layers includes an n-type dopant, and the plurality of second pits in the first semiconductor layer are coupled to the single first pit.

13. A light emitting element comprising:
a first semiconductor layer;
a second semiconductor layer disposed on the first semiconductor layer;
an active layer disposed on the second semiconductor layer; and
a third semiconductor layer disposed on the active layer,
wherein the second semiconductor layer includes a first nitride layer and a second nitride layer on the first nitride layer, wherein the first nitride layer is AlGaN-based, and the second nitride layer is formed of a different semiconductor from a semiconductor of the first nitride layer,
wherein each of the first and second semiconductor layers has a plurality of first pits and a plurality of second pits formed therein, wherein each first pit has a first depth from a top face of each of the first and second semiconductor layers, and each second pit has a second depth smaller than the first depth, and the first and second pits are connected to each other,
wherein the first and second pits are formed in the active layer,
wherein a density of the second pits in an upper portion of the second semiconductor layer is lower than a density of the second pits in an upper portion of the first semiconductor layer,
wherein a density of the first pits in the upper portion of the second semiconductor layer is equal to a density of the first pits in the upper portion of the first semiconductor layer, wherein a density of the second pits in the active layer is lower than a density of the second pits in the first semiconductor layer, and wherein each of the first and second semiconductor layers includes an n-type dopant.

14. The element of claim 13, wherein the plurality of second pits are connected to at least one of the first pits.

15. The element of claim 14, wherein a portion of the plurality of the second pits are disposed at an outside of a region of the first pit.

16. The element of claim 14, wherein the second semiconductor has a flat surface that is a vertically overlapped region with the plurality of the second pits connected to the first pit.

17. The element of claim 13, wherein the device includes dislocations coupled to the first and second pits.

18. The element of claim 13, wherein the first nitride layer include a semiconductor formed of AlGaN or InAlGaN, and the second nitride layer includes a semiconductor formed of GaN or InGaN, and the first semiconductor layer has a thickness greater than the first depth.

19. The element of claim 18, wherein the first nitride layer has a thickness smaller than or equal to ⅓ of the first depth, and the second depth is smaller than 15 nm, and the second nitride layer has a thickness equal to or smaller than a thickness of the first nitride layer.

20. The element of claim 13, wherein the first nitride layer includes aluminum, whose content is 5% to 20%, wherein the second nitride layer is made of an InGaN semiconductor, and the indium (In) content in the second nitride layer is equal to or smaller than 7%, wherein a stack of first and second nitride layers includes a cycle of two to five times.

* * * * *